(12) United States Patent
Wu et al.

(10) Patent No.: US 8,345,440 B2
(45) Date of Patent: Jan. 1, 2013

(54) INDUSTRIAL MODULE ASSEMBLING APPARATUS

(75) Inventors: Yuh Lin Wu, Zhudong Township (TW); Lih Guong Jang, Hsinchu (TW); Hsiao Hu Tan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 223 days.

(21) Appl. No.: 12/647,075

(22) Filed: Dec. 24, 2009

(65) Prior Publication Data

US 2011/0058341 A1 Mar. 10, 2011

(30) Foreign Application Priority Data

Sep. 10, 2009 (TW) .............................. 98130481 A

(51) Int. Cl.
*H05K 1/14* (2006.01)
(52) U.S. Cl. ........................................................ 361/788
(58) Field of Classification Search .................. 361/788, 361/679.32, 724, 729, 733, 735, 747, 796
See application file for complete search history.

(56) References Cited

U.S. PATENT DOCUMENTS

| | | | |
|---|---|---|---|
| 4,700,230 A | 10/1987 | Pshtissky et al. | |
| 5,912,979 A | 6/1999 | Gavrilos | |
| 6,188,381 B1 | 2/2001 | van der Wal et al. | |
| 2005/0091304 A1 | 4/2005 | Trayler | |
| 2005/0122677 A1* | 6/2005 | Clark et al. | 361/686 |
| 2008/0101049 A1* | 5/2008 | Casto et al. | 361/788 |
| 2008/0136259 A1* | 6/2008 | Coffey et al. | 307/11 |
| 2010/0328072 A1* | 12/2010 | Price et al. | 340/568.3 |

FOREIGN PATENT DOCUMENTS

| | | |
|---|---|---|
| CN | 101179706 A1 | 5/2008 |
| TW | 508019 | 10/2002 |
| TW | 200530786 A | 9/2005 |
| TW | 200818915A A | 4/2008 |

OTHER PUBLICATIONS

R.O.C. Office Action (both original and translated into English).
May 31, 2021 Office Action issued by Chinese Patent Office for counterpart Chinese application.
May 31, 2021 Office Action issued by Chinese Patent Office for counterpart Chinese application translated into English.

* cited by examiner

*Primary Examiner* — Jeremy Norris
*Assistant Examiner* — Tremesha S Willis
(74) *Attorney, Agent, or Firm* — Egbert Law Offices, PLLC

(57) ABSTRACT

An industrial module apparatus includes a frame, a module signal integrated backplane, a plurality of function modules and a module terminal panel. The module signal integrated backplane is disposed at a side of the frame. The function modules can be inserted into the frame and electrically connected to the module signal integrated backplane for signal transmission, and can be removed from the frame for replacement. The function modules include a video analysis module, a network module, and/or a sensing module. The module terminal panel is connected to the module signal integrated backplane and serves as a signal transmission port for the function modules.

19 Claims, 5 Drawing Sheets

INDUSTRIAL MODULE ASSEMBLING APPARATUS

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates to an industrial module apparatus, and more specifically, relates to a field of security surveillance.

2. Description of Related Art Including Information Disclosed Under 37 CFR 1.97 and 37 CFR 1.98.

Security surveillance is one of the most popular development fields, as demand for the security of individuals, homes and neighborhoods, and public places increases. With increases in terrorist attacks such as those of Sep. 11, 2001, countries have increased focus on national security issues, and the huge growth of rapidly developing economies is also triggering the development of security surveillance. From a technical point of view, advanced imaging and network transmission technologies are making security surveillance more convenient and widespread.

Usually, control or signal cables of a control apparatus are connected to the application modules or functional modules. During maintenance activities, the original cables have to be disconnected for replacing a module, and the cables reconnected afterwards. Because external communication cables are directly connected to the modules, the cable connection may be messy. Therefore, maintenance can be time-consuming and errors may occur when reconnecting the cables.

Moreover, a traditional industrial security module apparatus only includes a detection functional module capable of performing simple detection, and cannot verify abnormal activities or respond efficiently. As a result, the security surveillance function is limited and cannot provide complete security surveillance control.

BRIEF SUMMARY OF THE INVENTION

The present invention discloses an industrial module apparatus, which may be a frame surveillance system including function modules, a module signal integrated backplane and a module terminal panel. The industrial module apparatus is a modular hardware design complying with industrial standards, and thus is easily used for on-site installation, maintenance and replacement.

In accordance with an embodiment of the present invention, an industrial module apparatus includes a frame, a module signal integrated backplane, a plurality of function modules and a module terminal panel. The module signal integrated backplane is disposed at a side of the frame. The function modules can be inserted into the frame and electrically connected to the module signal integrated backplane for signal transmission, and can be removed from the frame for replacement. The function modules include a video analysis module, a network module, and/or a sensing module. The module terminal panel is connected to the module signal integrated backplane and serves as a signal transmission port for the function modules.

DETAILED DESCRIPTION OF THE INVENTION

The embodiments will be explained with the appended drawings to clearly disclose the technical characteristics of the present invention.

Figure 1:
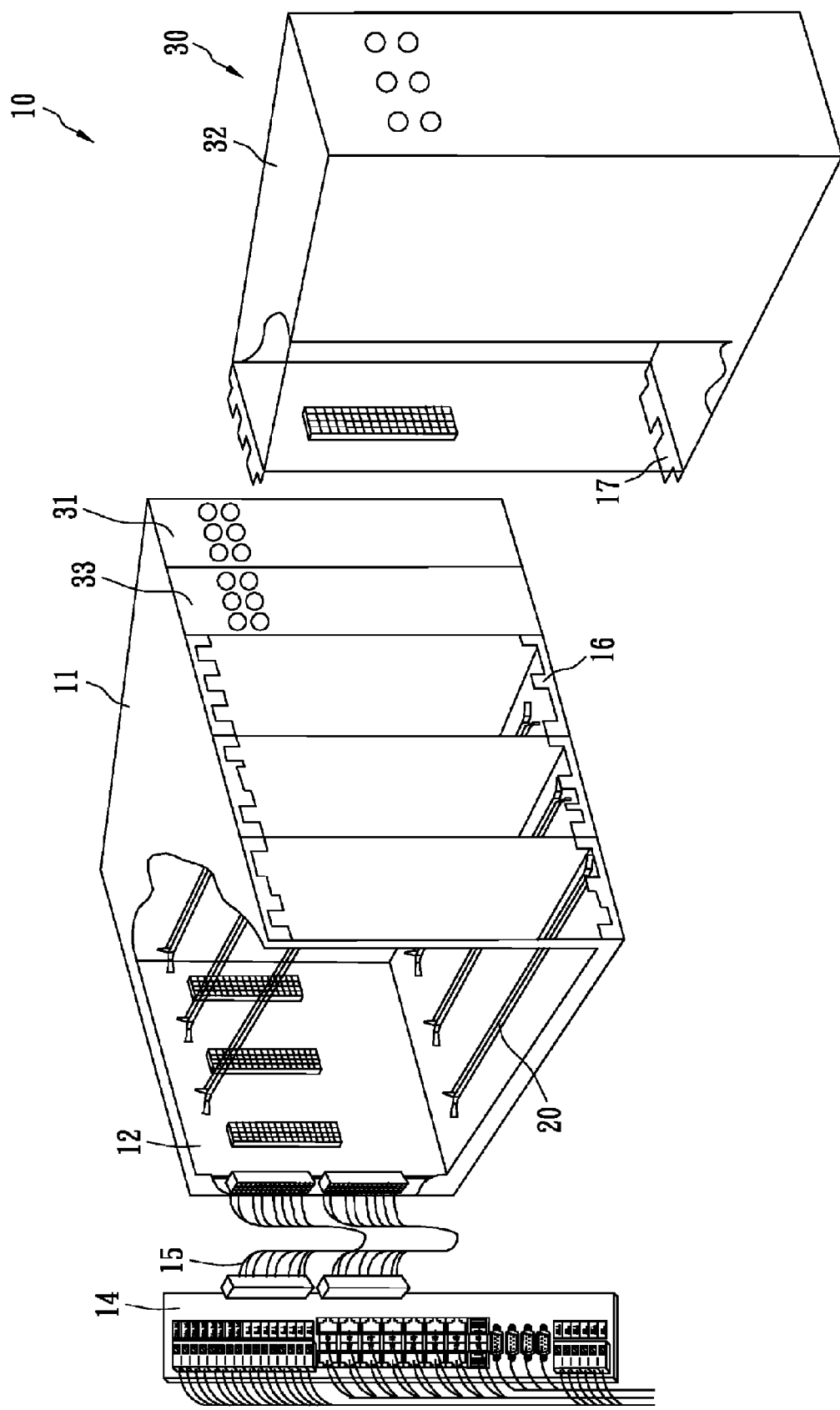
FIG. 1 shows a schematic view of an industrial module apparatus in accordance with an embodiment of the present invention.

FIG. 1 shows an industrial module apparatus 10 in accordance with an embodiment of the present invention. The industrial module apparatus 10 includes a frame 11, a module signal integrated backplane 12, function modules 30 and a module terminal panel 14. The function modules 30 may include an intelligent video analysis module 32, a network module 31 and/or a heterogeneity sensing module 33. The module signal integrated backplane 12 is disposed at a side (e.g., the rear side) of the frame 11. The function modules 30 such as the video analysis module 32, the network module 31 and/or the sensing module 33 can be inserted into the frame 11 through slide rails 20 and can be electrically connected to the module signal integrated backplane 12 for signal transmission. They also can be removed from the frame 11 for module replacement. The function modules 30 can be combined as desired; for example, the function modules 30 may include only the network module 31 and sensing module 33. The module terminal panel 14 is electrically connected to the module signal integrated backplane 12 and serves as a signal transmission port between the function modules 30 and external devices. In this embodiment, the module signal integrated backplane 12 and function modules 30 are disposed in the frame 11, and the module terminal panel 14 is separate from the frame 11. The module terminal panel 14 includes external signal terminals of various types with respect to each function module 30, and various cables of remote devices connect with the module terminal panel 14. The network module 31 may be an Ethernet server module or a wireless module.

In practice, the module signal integrated backplane 12 may be connected to a separated module terminal panel 14 through an electromagnetic compatibility (EMC) and/or an electromagnetic interference (EMI) shielding cable harness 15 as shown in FIG. 1, or the module signal integrated backplane 12 can be directly connected to the module terminal panel 14.

The frame 11 has a plurality of slots formed at a side opposite to the module signal integrated backplane 12. The slot has an upper front and a lower front, each of which is equipped with a foolproof device or a fool-proof device. In this embodiment, the upper and lower fronts of the frame 11 are provided with guidance bases 16. If the guidance key 17 of a function module 30 such as the video analysis module 32, the network module 31, or the sensing module 33 matches the guidance base 16, the guidance base 16 may tilt by 90 degrees so as to allow insertion of the function module 30 at the correct place. Moreover, the guidance base 16 of each slot of the frame 11 and the corresponding guidance key 17 of the function module 30 may be painted the same color, so that the user can easily identify the corresponding slot to avoid incorrect insertion when inserting the function module 30. In other words, the user can identify, based on matching color, the correct slot of the frame 11 into which the function module 30 is to be inserted. The foolproof device is visible by the user, so as to easily avoid incorrect insertion by identifying colors.

Figure 2A:
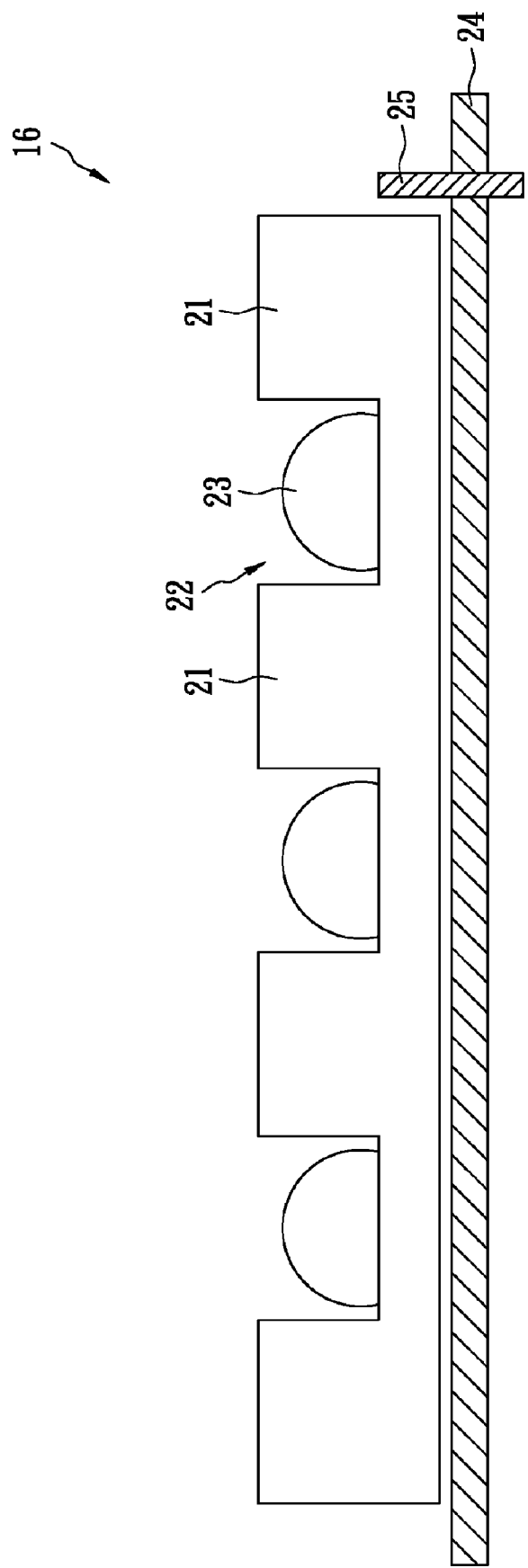
FIG. 2A shows a schematic view of a foolproof guidance base for avoiding incorrect insertion in accordance with an embodiment of the present invention.

FIG. 2A shows a foolproof guidance base 16 in accordance with an embodiment of the present invention. The guidance base 16 includes protrusions 21, and recesses 22 are formed between the protrusions 21. Ball bearings 23 are disposed in the recesses 22. The guidance base 16 can tilt or rotate along the rotation axle 24 that is driven by the rod 25. When the guidance key 17 of the function module 30 and the guidance base 16 are matched and their colors are the same, the guidance key 17 is inserted into the guidance base 16 by which the rolling balls 23 are pressed down and the function module 30 is moved on the ball bearings 23 to be inserted into the frame 11.

Figure 2B:
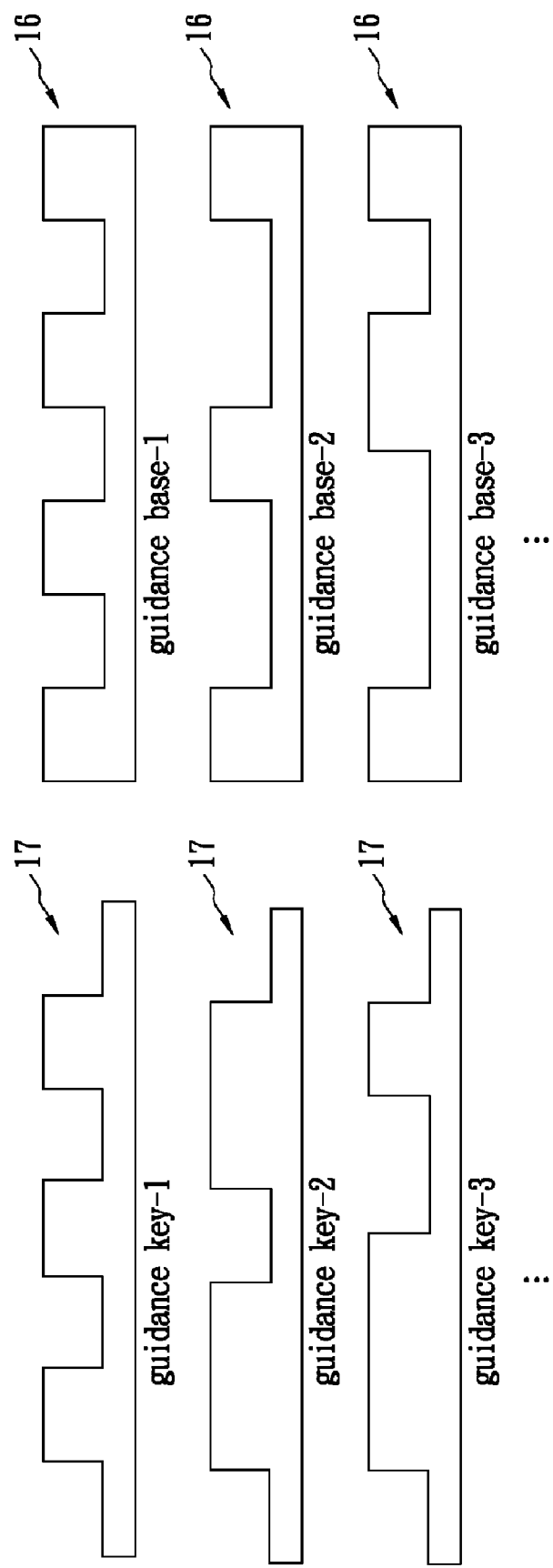
FIG. 2B shows a schematic view of various foolproof guidance bases for avoiding incorrect insertion in accordance with an embodiment of the present invention.

FIG. 2B shows various foolproof devices for avoiding incorrect insertion. They are guidance base-1, guidance base-2, and guidance base-3, and corresponding guidance key-1, guidance key-2, and guidance key-3. The guidance key 17 and the corresponding guidance base 16 may be painted with the same color. For example, the guidance base-1 and the guidance key-1 may be painted with yellow color; the guidance base-2 and the guidance key-2 may be painted with green color, and the guidance base-3 and the guidance key-3 may be painted with red color. Accordingly, the incorrect insertion of the function module 30 can be further avoided by color difference.

Figure 3:
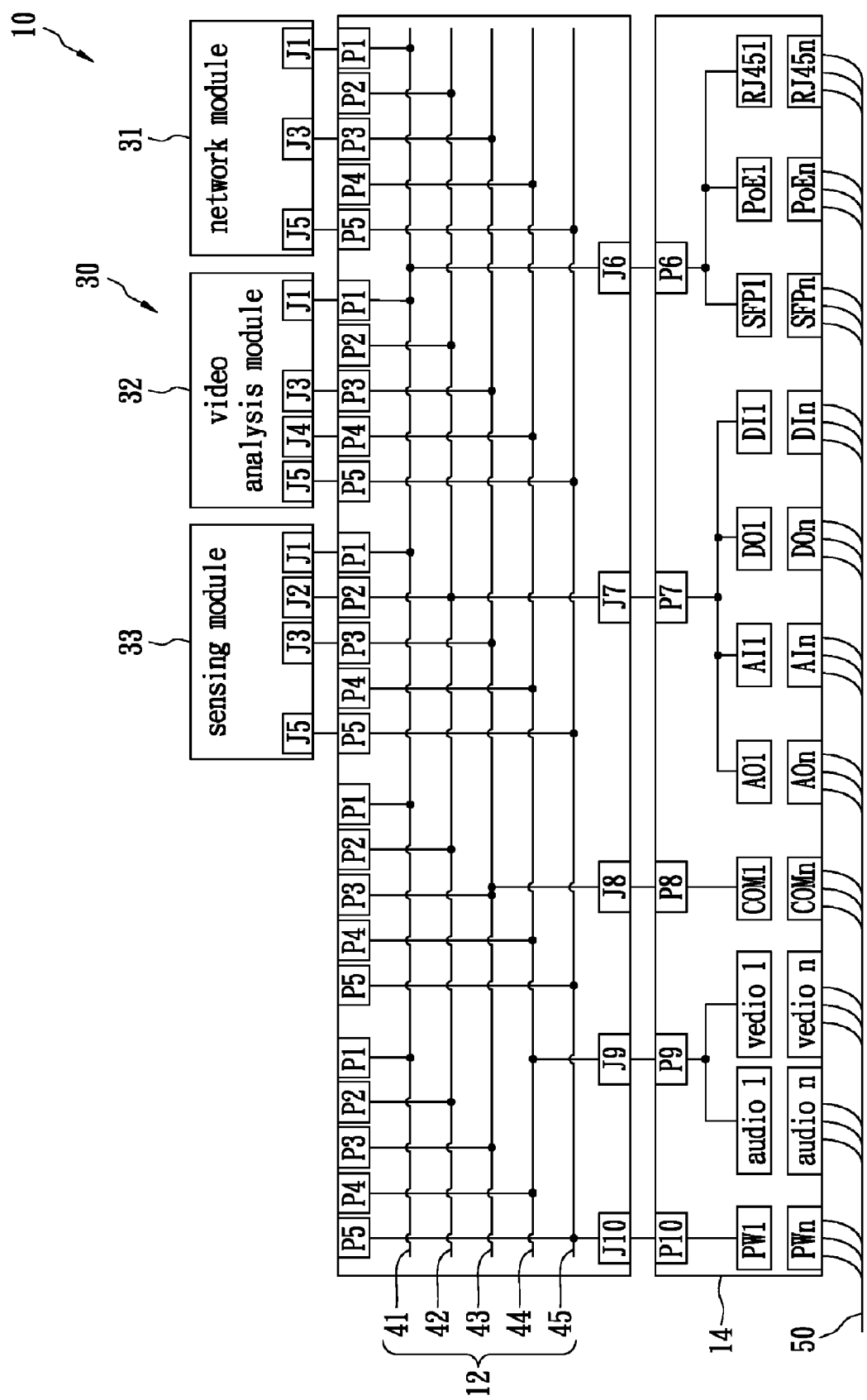
FIG. 3 shows a schematic view of a circuit layout for an industrial module apparatus in accordance with an embodiment of the present invention.

The circuitry of the industrial module apparatus 10 of an embodiment is shown in FIG. 3, in which the communication between the network module 31, the video analysis module 32 and the sensing module 33 can be accomplished by using the module signal integrated backplane 12, i.e., control parameter commands, algorithm analysis results, image signals and audio signals are transmitted through the module signal integrated backplane 12. The module signal integrated backplane 12 includes an Ethernet Bus 41, an Input/Output (I/O) Bus 42, a Serial Bus 43, a Video/Audio Bus 44 and a power bus 45. Such buses are further connected to the module terminal panel 14 composed of various I/O ports for signal transmission with a sensing apparatus or a cable harness 50.

Further, the data exchange and control command transmission between the function modules 30 are accomplished by the circuits of the module signal integrated backplane 12, and external sensing signals or remote data communication are transmitted to the function modules 30 through the module terminal panel 14 and the circuits of the module signal integrated backplane 12. From a functional point of view, the function module 30 may include a video surveillance module, an access control module, an alarm module, a broadcasting module, and a networking module.

Figure 4:
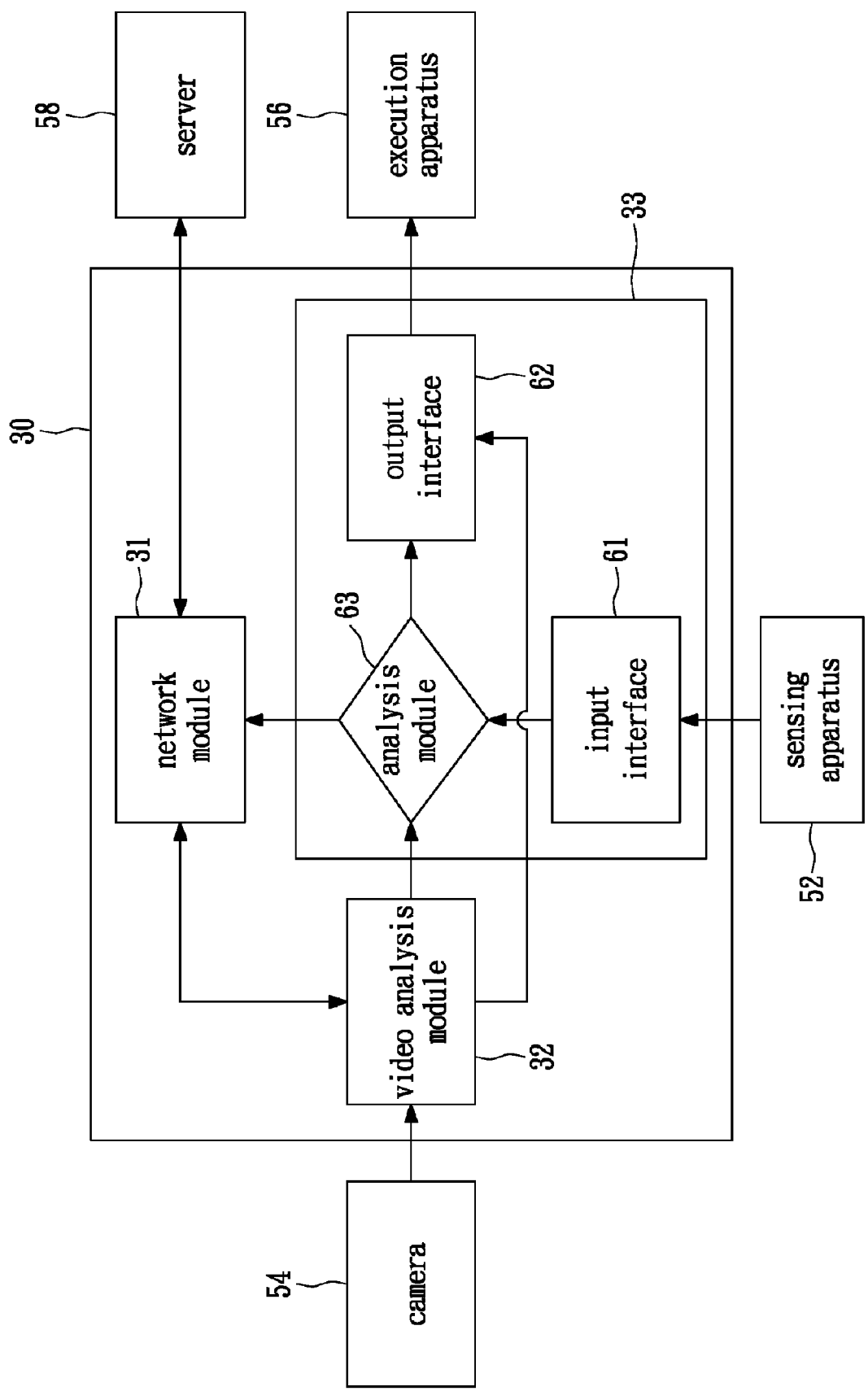
FIG. 4 shows a schematic view of a control mechanism of an industrial module apparatus in accordance with an embodiment of the present invention.

The control mechanism of the industrial module apparatus 10 is shown in FIG. 4. The sensing module 33 receives sensing signals of the sensing apparatus 52 through an input interface 61. An intelligence analysis algorithm 63 performs data fusion according to the sensing signals and analysis results of the video analysis module 32. The sensing signals may be obtained by a wireless RFID reader, a temperature sensor or a pressure gauge.

The data fusion signals of the sensing module 33 are transmitted to the remote execution apparatus 56 through the output interface 62, and the data fusion signals may also be transmitted to the network module 31. The network module 31 communicates the data fusion signals of the sensing module 33 and the analysis results of the video analysis module 32 to the server 58. In an embodiment, the analysis results of the video analysis module 32 are obtained by a camera 54. To simplify the drawings and facilitate understanding, the input and/or output module terminal panel 14 is omitted in FIG. 4 since the module terminal panel 14 only serves as an interface.

In summary, the function modules 30 receive sensing signals from cameras 54 or external sensing apparatuses 52 such as infrared sensing devices or readers, control external execution apparatus 56, or transmit data to a server 58 through the module signal integrated backplane 12 and the module terminal panel 14.

The industrial module apparatus of the present invention serves the following functions: (1) collection and centralized wiring to the separated module terminal panel 14; and (2) providing a frame surveillance control system with foolproof devices. The single module of the present invention can be replaced with a new application or function module by hot-plugging, so as to achieve the objective of easy on-site installation and maintenance. In accordance with the present invention, the internal communication signals of all the function modules are connected through the module signal integrated backplane. The function module receives or transmits external signals through the module signal integrated backplane and the separated module terminal panel, and the related cables are gathered and connected to the separated module terminal for easy on-site installation and maintenance.

The above-described embodiments of the present invention are intended to be illustrative only. Numerous alternative embodiments may be devised by those skilled in the art without departing from the scope of the following claims.

We claim:

1. An industrial module apparatus, comprising:
    a frame;
    a module signal integrated backplane disposed at a side of the frame;
    a plurality of function modules capable of being inserted into the frame and electrically connected to the module signal integrated backplane for signal transmission, and removed from the frame for replacement, wherein the function modules include a video analysis module, a network module, a sensing module or the combination thereof; and
    a module terminal panel disposed separately from said plurality of function modules, said module terminal panel being electrically connected to the module signal integrated backplane as a collective and centralizing signal transmission interface for the function modules through an EMI shielding harness.

2. The industrial module apparatus of claim 1, wherein the sensing module receives sensing signals and analysis results of the video analysis module, and performs data fusion by an analysis algorithm.

3. The industrial module apparatus of claim 2, wherein the sensing signals are generated by a wireless radio frequency identification (RFID) reader, a temperature sensor or a pressure gauge.

4. The industrial module apparatus of claim 2, wherein analysis signals of the sensing module are transmitted to a remote action apparatus or the network module.

5. The industrial module apparatus of claim 4, wherein the network module communicates data fusion results of the sensing module and analysis results of the video analysis module to a server.

6. The industrial module apparatus of claim 5, wherein the video analysis module receives image signals from a camera.

7. The industrial module apparatus of claim 1, wherein the frame has a foolproof device placed at a side of the frame opposite to the module signal integrated backplane for avoiding incorrect insertion of the function modules.

8. The industrial module apparatus of claim 7, wherein the foolproof device is visible to the user, includes a guidance base placed on the frame and a corresponding guidance key placed on the function module, and the guidance base and the guidance key are of different shapes for each of the function modules.

9. The industrial module apparatus of claim 7, wherein the foolproof device is visible to the user, includes a guidance base placed on the frame and a corresponding guidance key placed on the function module, and the guidance base and the guidance key are of different colors for each of the function modules.

10. The industrial module apparatus of claim 1, wherein the module signal integrated backplane serves as an interface for signal communication between function modules.

11. The industrial module apparatus of claim 1, wherein the signals between the function modules comprise control parameter commands, algorithm analysis results, image signals and audio signals.

12. The industrial module apparatus of claim 1, wherein the module terminal panel is separated from the module signal integrated backplane.

13. The industrial module apparatus of claim 12, further comprising a signal cable connecting the module terminal panel and the module signal integrated backplane.

14. The industrial module apparatus of claim 13, wherein the signal cable is of electromagnetic compatibility and/or electromagnetic interference shielding type.

15. The industrial module apparatus of claim 2, wherein the module terminal panel serves as an interface for receiving signals from a remote sensing apparatus or controlling a remote action apparatus.

16. The industrial module apparatus of claim 15, wherein the remote sensing apparatus comprises a camera, a wireless RFID reader, a temperature sensor, or a pressure gauge.

17. The industrial module apparatus of claim 15, wherein the module terminal panel further transmits signals to a server.

18. The industrial module apparatus of claim 1, wherein the module terminal panel includes external signal terminals of various types with respect to the function modules, and remote equipment wiring is collected and centralized on the module terminal panel.

19. The industrial module apparatus of claim 1, wherein the network module is an Ethernet server module or a wireless module.

* * * * *